(12) United States Patent
Beschnitt et al.

(10) Patent No.: US 10,635,177 B2
(45) Date of Patent: Apr. 28, 2020

(54) OPERATING UNIT FOR A VEHICLE

(71) Applicant: BEHR-HELLA THERMOCONTROL GMBH, Stuttgart (DE)

(72) Inventors: Alexander Beschnitt, Herford (DE); Harri Pankratz, Bad Sassendorf (DE)

(73) Assignee: BEHR-HELLA THERMOCONTROL GMBH, Stuttgart (DE)

( * ) Notice: Subject to any disclaimer, the term of this patent is extended or adjusted under 35 U.S.C. 154(b) by 0 days.

(21) Appl. No.: 16/315,695

(22) PCT Filed: Jul. 10, 2017

(86) PCT No.: PCT/EP2017/067283
§ 371 (c)(1),
(2) Date: Jan. 7, 2019

(87) PCT Pub. No.: WO2018/007646
PCT Pub. Date: Jan. 11, 2018

(65) Prior Publication Data
US 2019/0302891 A1 Oct. 3, 2019

(30) Foreign Application Priority Data
Jul. 8, 2016 (DE) .................... 10 2016 212 524

(51) Int. Cl.
*G09G 5/00* (2006.01)
*G06F 3/01* (2006.01)
(Continued)

(52) U.S. Cl.
CPC ............. *G06F 3/016* (2013.01); *B60K 35/00* (2013.01); *B60K 37/06* (2013.01); *G05G 5/03* (2013.01);
(Continued)

(58) Field of Classification Search
CPC ............. B06B 1/045; B60K 2370/143; B60K 2370/1438; B60K 2370/158;
(Continued)

(56) References Cited

U.S. PATENT DOCUMENTS 6,661,219 B2 12/2003 Schmidt
2005/0140776 A1* 6/2005 Kurzweil ............ G06F 3/04815
348/14.01
(Continued)

FOREIGN PATENT DOCUMENTS

DE 100 43 805 A1 3/2002
DE 10 2008 035907 A1 2/2010
(Continued)

OTHER PUBLICATIONS

International Search Report (with partial translation) and Written Opinion issued in Application No. PCT/EP2017/067283 dated Oct. 12, 2017.

*Primary Examiner* — Insa Sadio
(74) *Attorney, Agent, or Firm* — Morgan, Lewis & Bockius LLP

(57) ABSTRACT

An infotainment system having an operating element for a vehicle is disclosed. The operating element is mounted in a spring-elastic manner with springs on and/or in a housing along a vertical axis of movement. One or more sensors for detecting an actuating movement of the operating element can also be included. The operating unit can further have an actuator arranged in and/or on the housing for feedback movement of the operator control element. Torques acting at a center of mass of the operating element as a result of the return spring elements can cancel one another out, with the result that during the feedback movement of the operating
(Continued)

Figure 1:
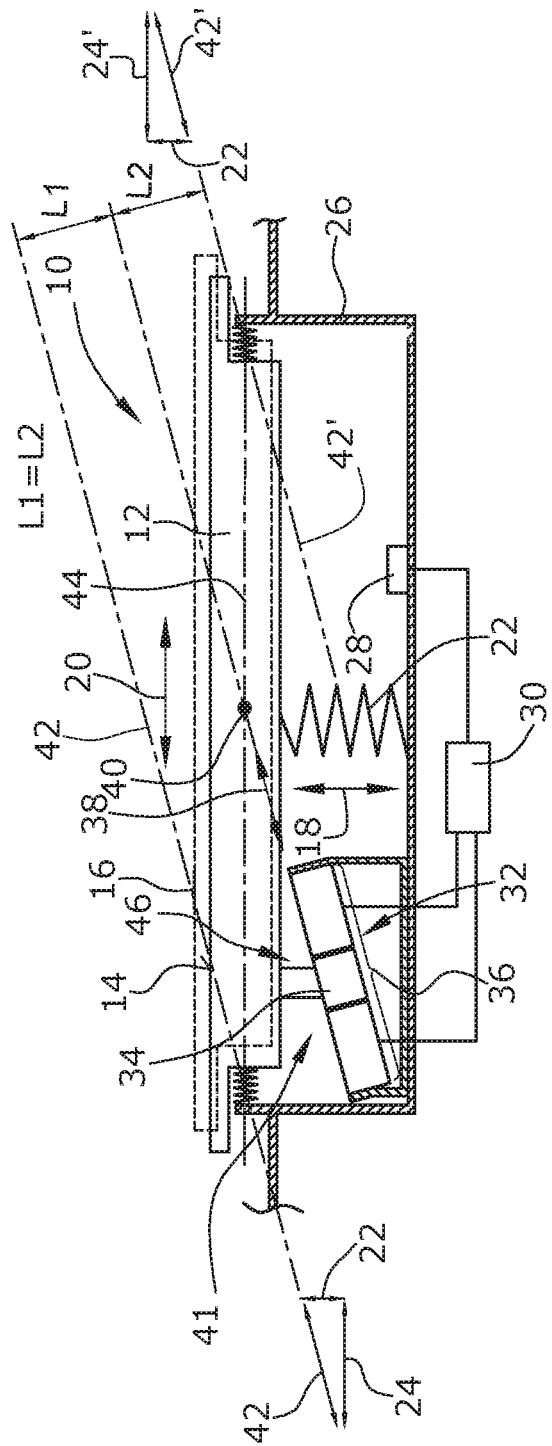

element along the axis of effective movement of the drive element of the actuator said operating element does not additionally rotate or tilt.

8 Claims, 5 Drawing Sheets

(51) Int. Cl.
    *B60K 35/00*      (2006.01)
    *B60K 37/06*      (2006.01)
    *G06F 3/0338*      (2013.01)
    *G05G 5/03*      (2008.04)
    *B06B 1/04*      (2006.01)

(52) U.S. Cl.
CPC ............ *G06F 3/0338* (2013.01); *B06B 1/045* (2013.01); *B60K 2370/143* (2019.05); *B60K 2370/1438* (2019.05); *B60K 2370/158* (2019.05); *B60K 2370/691* (2019.05); *G06F 2203/014* (2013.01); *H03K 2217/96062* (2013.01)

(58) Field of Classification Search
CPC .. B60K 2370/691; B60K 35/00; B60K 37/06; G05G 5/03; G06F 2203/014; G06F 3/016; G06F 3/0338; H03K 2217/96062
See application file for complete search history.

(56) References Cited

U.S. PATENT DOCUMENTS

2015/0291034 A1    10/2015   Marquas
2016/0070348 A1*   3/2016   Cowley .................. G06F 3/016
                                               345/156

FOREIGN PATENT DOCUMENTS

| DE | 10 2009 007243 A1 | 8/2010 |
| DE | 10 2012 221 107 B3 | 5/2014 |
| JP | 2003-058321 A | 2/2003 |
| WO | 01/54109 A1 | 7/2001 |
| WO | 2017/045975 A1 | 3/2017 |
| WO | 2017/046026 A1 | 3/2017 |
| WO | 2017/129557 A1 | 8/2017 |

* cited by examiner

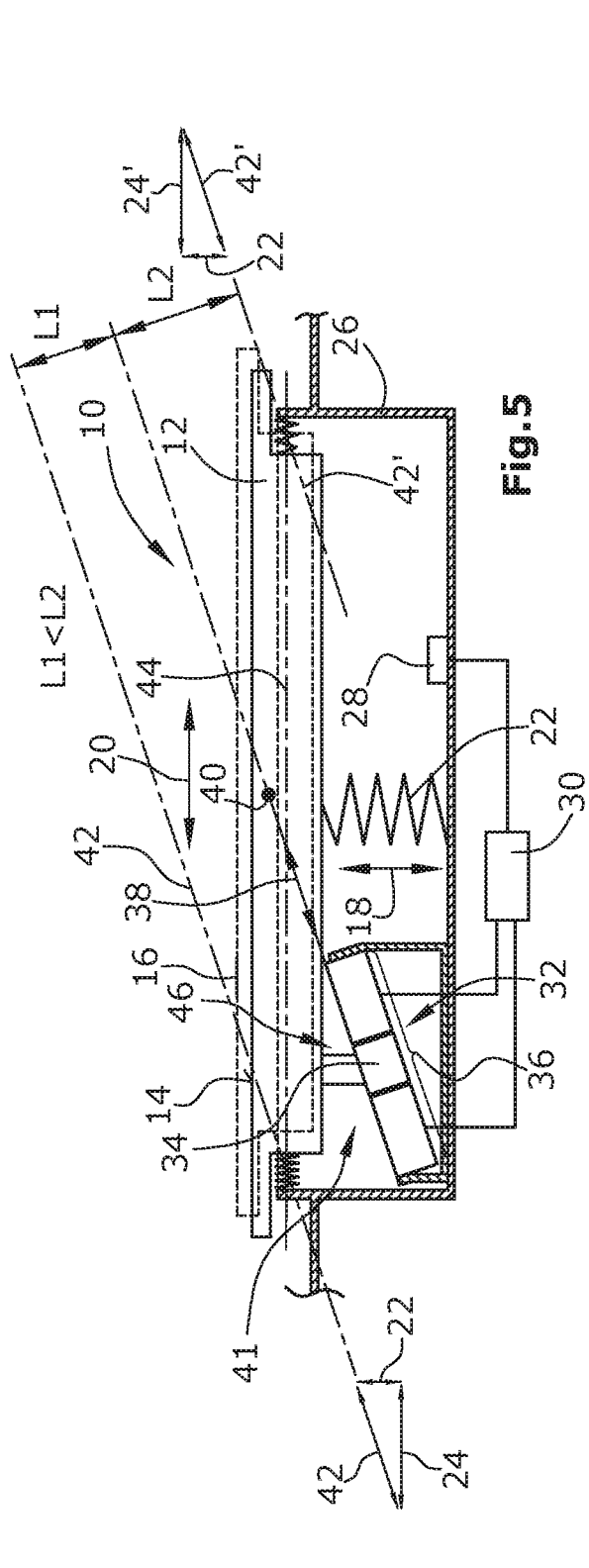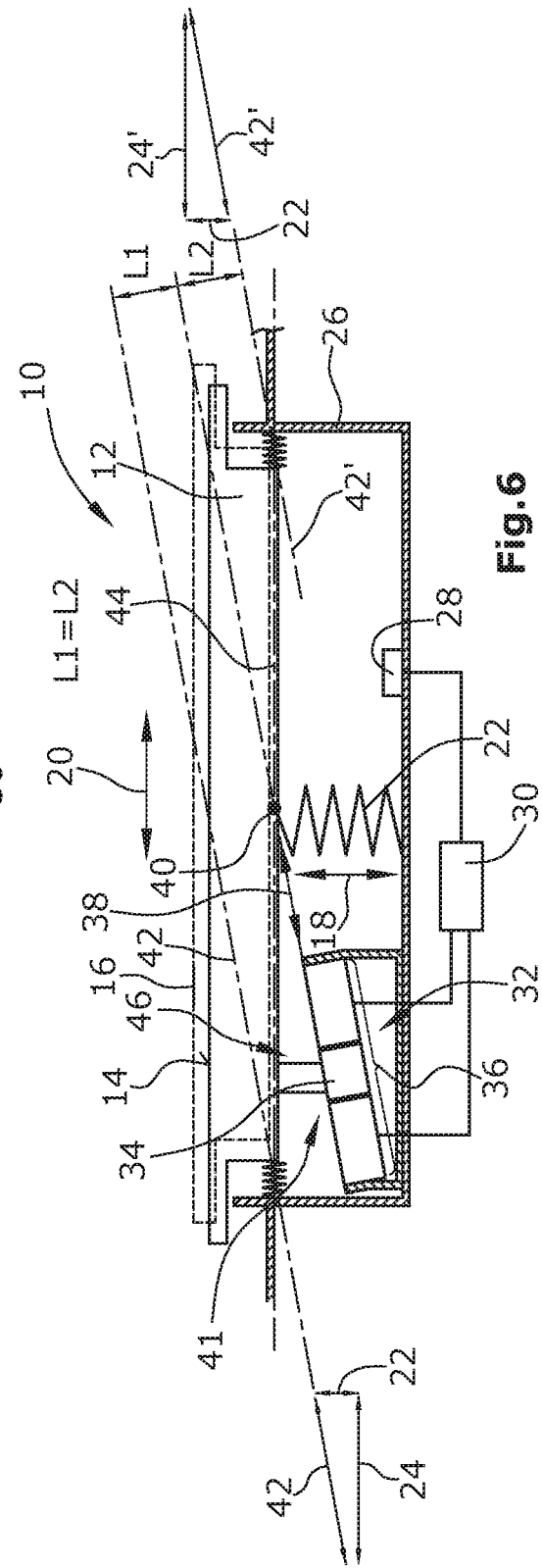

OPERATING UNIT FOR A VEHICLE

The present patent application claims the priority of German Patent Application 10 2016 212 524.9, dated Jul. 8, 2016, whose subject matter is herewith included into the subject matter of the present patent application by way of reference. Further, also the subject matter of the three PCT applications PCT/EP2016/070989, dated Sep. 6, 2016, PCT/EP2016/071414, dated Sep. 12, 2016, and PCT/EP2017/051416, dated Jan. 24, 2017, are included into the subject matter of the present patent application by way of reference.

The invention relates to an operating unit for a vehicle, which can be e.g. an infotainment system for control of diverse vehicle components.

Operating units comprising display assemblies adapted for e.g. menu-driven display of various symbol fields for selection of functions for a vehicle component, find ever increasing acceptance. In such operating units, it is desired that the user receives a tactile confirmation of the selection of a function, which is effected e.g. by an additional active movement of the operating element after it has been actuated. This haptic feedback, when viewed across the whole operating surface of the operating element, shall be as homogenous as possible. Examples of such operating units are described in DE-A-10 2008 035 907 and DE-A-10 2009 007 243. Further, in DE-A-100 43 805, there is described a device comprising an electromagnetic actuator.

It is an object of the invention to provide an operating unit for a vehicle that comprises at least one operating element with operating surface, wherein, independently from the site where the operating surface is touched and actuated, the haptic sensation is substantially identical, and that is furnished with an active haptic feedback.

To achieve the above object, there is proposed, in accordance with the invention, an operating unit for a vehicle, wherein the operating unit is provided with a housing having a front side, an operating element arranged on the front side of the housing (26) and comprising an operating interface, wherein the operating element is mounted in a spring-elastic manner by means of return springs on and/or in the housing along a vertical axis of movement extending substantially orthogonally with respect to the operating surface and along a lateral axis of movement extending substantially transversely with respect to the vertical axis of movement, at least one sensor for detecting an actuating movement of the operating element in the direction of the vertical axis of movement, an actuator, arranged in and/or on the housing, for feedback movement of the operating element at least also in the lateral axis of movement when an actuation movement of the operating element is detected, wherein the actuator has an electrically activated drive element which is mechanically coupled to the operating element and can be moved forward and backward along an axis of effective movement, and an evaluating and control unit which is connected to the sensor and the actuator, wherein the return springs have resultant spring effect axes which extend parallel to the axis of effective movement of the actuator, wherein the spring effect axes of the return springs, when viewed in the vertical plane in which the axis of effective movement of the actuator extends and/or in which the center of mass of the operating element or of the movable mass including inter alia the operating element and the drive element, coupled thereto, of the actuator is situated, extend on both sides of the axis of effective movement of the actuator at first and second distances to the axis of effective movement of the actuator, and that the dimensioning of the return springs with respect to their spring forces and the first and the second distance are selected to substantially compensate for the moments of rotation acting as a result of the return springs in the center of mass of the operating element or of the movable mass.

According to the invention, it is provided that the return springs have resultant spring effect axes which extend parallel to the axis of effective movement of the actuator, the spring effect axes of the return springs, when viewed in the vertical plane in which the axis of effective movement of the actuator extends and/or in which the center of mass of the operating element or of the movable mass including inter alia the operating element and the drive element, coupled thereto, of the actuator is situated, extend on both sides of the axis of effective movement of the actuator at first and second distances to the axis of effective movement of the actuator, and the dimensioning of the return springs with respect to their spring forces and the first and the second distance are selected to substantially compensate for the moments of rotation acting as a result of the return springs in the center of mass of the operating element or of the movable mass.

According to the invention, the active haptic feedback of an actuation of the operating element is realized by a lateral deflection of the operating element. For actuation, the operating element is moved in a vertical axis of movement extending substantially orthogonally to the operating surface. When this actuation movement is then detected by a sensor, there will occur an active movement of the operating element in a lateral direction of movement (e.g. from left to right, upward or downward). In this respect, care has to be taken that the operating element will not tilt, which, however, is nearly excluded without special measures if, as normally is the case, the connection of the actuator to the operating element is not located in the center of mass of the latter. The operating element substantially comprises a display with corresponding display technique and technology (e.g. an LCD display) and backlighting so that the operating element may have a non-negligible construction depth. Since, in the ideal case, the actuator can in the extreme case be located directly below this operating element, its drive element, for generating an active haptic feedback movement in the lateral direction of movement, will engage the operating element and respectively the moved partial system outside the center of mass of the element or the system. As a consequence, unless corresponding countermeasures are taken, the operating element will inevitably be tilted, which is undesired. Known solutions are aimed at a forced guidance with corresponding design of the spring system by which the operating element is supported on the housing of the operating unit. All of this is mechanically complex.

Thus, according to the invention, there is effected a compensation for the moments of rotation acting on the operating element under the effect of the (vertical and lateral) return springs, which can be realized, on the one hand, by the positioning of the return springs relative to the effective axis of movement of the drive element and/or, on the other hand, by the dimensioning of the return springs and/or, further, by "relocation" of the mass center of the operating element by influencing the weight distribution of the operating element (by placement of additional weights or by influencing the weight distribution in a well-aimed manner). Thus, if the situation of the installation space does not allow for a relocation of the return spring, compensation of the moment of rotation can be achieved by the dimensioning of the return springs and/or by a change of the mass distribution within the operating element. As a result, the invention allows for sufficient degrees of freedom for the design in all applications. Put more precisely, there has to be considered not only the center of mass of the operating element but the center of mass of the movable partial system of the operating unit, wherein this movable partial system includes the operating element, the drive element of the actuator inclusive of its attachment to the operating element, and the return springs (which, however, have a negligible mass). The total mass to be moved for the haptic feedback defines the center of mass which in the framework of the invention is decisive for the arrangement and/or dimensioning of the return spring so as to realize the compensation of the moment of rotation. Thus, when mention is made hereunder of the center of mass of the operating element, this is meant to denote the center of mass of the movable, resiliently supported partial system which is mechanically activated for the haptic feedback.

According to a further advantageous embodiment of the invention, it is provided that the spring effect axes of the return springs, when viewed in an oblique plane which extends vertically to the vertical plane and in which the axis of effective movement of the actuator extends and/or in which the center of mass of the operating element is situated, extends on both sides of the axis of effective movement of the actuator at distances to the axis of effective movement of the actuator, and that the dimensioning of the return springs with respect to their spring forces and the distances are selected to substantially compensate for the moments of rotation acting as a result of the return springs in the center of mass of the operating element.

The considerations described above in connection with the vertical plane are applicable, in a corresponding manner, also in connection with the oblique plane defined by the orientation of the axis of effective movement of the actuator. Also in this oblique plane in which the axis of effective movement of the actuator is situated (and which consequently is spanned by this axis and extends orthogonally to the vertical axis), it is again required to compensate for the forces, resulting from the return springs, that act on the movable partial system, so that, with respect to this oblique plane and respectively to the horizontal projection plane, no oscillations will occur when the actuator is controlled for haptic, tactile feedback.

Further, the invention provides to arrange the actuator mechanically in such an orientation that the axis of effective movement of the drive element preferably intersects the center of mass of the operating element. Thus, the center of mass of the operating element is situated on the extension of the axis of effective movement of the drive element. In this arrangement, thus, the axis of effective movement of the drive element extends at an acute angle to the intended direction of lateral movement for the active haptic feedback. Accordingly, by the operating element being thus moved along the axis of effective movement of the drive element, the feedback movement of the operating element, apart from the intended component of lateral movement, also has a component of vertical movement which, however, does not cause any significant disturbance. What is decisive instead is that, during active haptic feedback, the operating surface of the operating element, will maintain its orientation in space, i.e. will undergo an obliquely oriented parallel displacement, notably without oscillating when viewed in the vertical and/or horizontal plane.

By the measure according to the invention, it is possible to carry out the feedback movement in a purely translational manner, wherein the effective direction of the drive element preferably extends through the center of mass of the operating element.

Rotatory portions of the movement during the active haptic feedback of the operating element are further reduced in that the return spring elements by which the operating element after a haptic feedback is returned into its starting position, are situated in a common plane with the center of mass of the operating element. If this were not the case, the pattern of the active haptic feedback movement of the operating element would comprise rotatory portions.

Alternatively, the spring effect axes can also coincide with the axis of effective movement of the drive element of the actuator; they are then arranged on a common line.

By the invention, it is advantageously achieved that the moments of rotation acting as a result of the return spring elements in the center of mass of the operating element will neutralize each other so that the operating element during its feedback movement along the axis of effective movement of the drive element of the actuator will not additionally twist or tilt.

Further, it is advantageous to perform an active control or feedback control of the haptics in the outbound and return paths. In this regard, it is also decisive that the movement of the operating element is, as far as possible, purely translational, which can be realized by the approach according to the invention. Further, by the approach according to the invention, it can be substantially safeguarded that the haptic feel is always identical irrespective of the site of the actuation on the user surface. With the invention, no need exists anymore for complex constructional solutions for a resilient support of the operating element to the effect that this element performs a purely translational movement.

It is useful if the axis of lateral movement of the operating element and the axis of effective movement of the drive element of the actuator span a common vertical plane standing substantially orthogonally to the operating surface.

According to a further embodiment of the invention, it can be provided that the housing below the operating element comprises an installation space, and that the actuator, for obtaining the smallest possible angle between the axis of effective movement of the drive element of the actuator and the axis of lateral movement of the operating element, is arranged as closely below the operating element as possible with regard to the installation space and/or as far away from the center of mass of the operating element as possible with regard to the installation space. The smaller the angle between the axis of effective movement of the actuator and the axis of lateral movement of the operating element is, the larger is the lateral movement portion of the operating element in relation to the lateral movement portion in the feedback movement.

According to a further embodiment of the invention, the operating unit comprises return spring elements, arranged on both sides of the operating element, for the operating element and having axes which are arranged on the lateral axis of movement or which are arranged in a plane that is substantially orthogonal to a plane spanned by the axis of effective movement of the drive element of the actuator and the axis of lateral movement of the operating element, and are arranged symmetrically to the axis of lateral movement.

Further, it can be provided that the actuator is formed as an armature solenoid comprising a first stator with a first exciter coil, and comprising an armature as a drive element, that the armature is provided with a measuring coil to which a measuring voltage is applied when the armature is permeated by a magnetic flow generated by the first exciter coil, and that the first exciter coil and the measuring coil are connected to the evaluating and control unit, wherein, by means of the evaluating and control unit, it is possible to perform a control or feedback control of the force by which the drive element of the actuator can be moved in the direction of the first stator, and a control or feedback control of the deflection movement of the drive element from its rest position and of the return movement of the drive element to its rest position.

This embodiment of the invention advantageously allows for relatively precise and inexpensive force measurement in an actuator, designed as a solenoid, for haptic feedback of operating elements. Herein, the solenoid can of the single-tied-rod type or of the dual-armature type. Alternatively, the actuator can comprise at least one piezoelectric element, i.e. it can function piezoelectrically.

For the haptic feedback, out of reasons related to the installation space and the costs, it is often a solenoid (armature magnet) without permanent magnets that is used as actuator. Thus, the stator of such an armature magnet is to be operated electromagnetically. For being able to set the desire movement of the operating surface of the operating element, it is required that the temporal force development at the actuator can be set with precision. Further, it may be required that the force for advance and return movement of the operating element is each time actively built up. This can be realized by means of a solenoid of the dual-armature type having a common armature between two electromagnetic stators.

The force of a solenoid is substantially dependent, in case of slowly varying magnetic fields, on the armature current and on the air gap between the armature and the stator. The force development in case of the haptic feedback is, however, very dynamic and comprises frequency portions above 1 kHz. In this regard, in case of the normally used free cutting steel and electrical sheets for magnetic flux guidance, the relationship between the electric current and the force is not trivial and can be described only by very complex modelling. Additionally, because of the mechanical tolerances and the movement of the operating surface, the air gap is not precisely known so that the force effect of an armature magnet can be estimated only roughly.

By the presently described approach involving the measurement of the magnetic flow passing through the armature by means of a measuring coil and the induced voltage which is dropping at this coil, it is now possible to perform a control or feedback control of the force and the movement of the armature. Further, it is now possible to dampen the movement of the armature in a well-aimed manner so that an overshoot in the respective end position of the advance and return movement of the armature can be avoided.

As already explained above, it is of further advantage if the armature is arranged between two electromagnetically operated stators. Thus, in this embodiment of the invention, the armature comprises a second stator having a second exciter coil, wherein the two stators are arranged on both sides of the armature and also the second exciter coil is connected to the evaluating and control unit, wherein, by means of the evaluating and control unit, it is possible to perform a control or feedback control of the respective force by which the drive element can be moved in the respective direction of the first and respectively the second stator, and a control or feedback control of the deflection movement of the drive element from its rest position and of the return movement of the drive element to its rest position.

Figure 2:
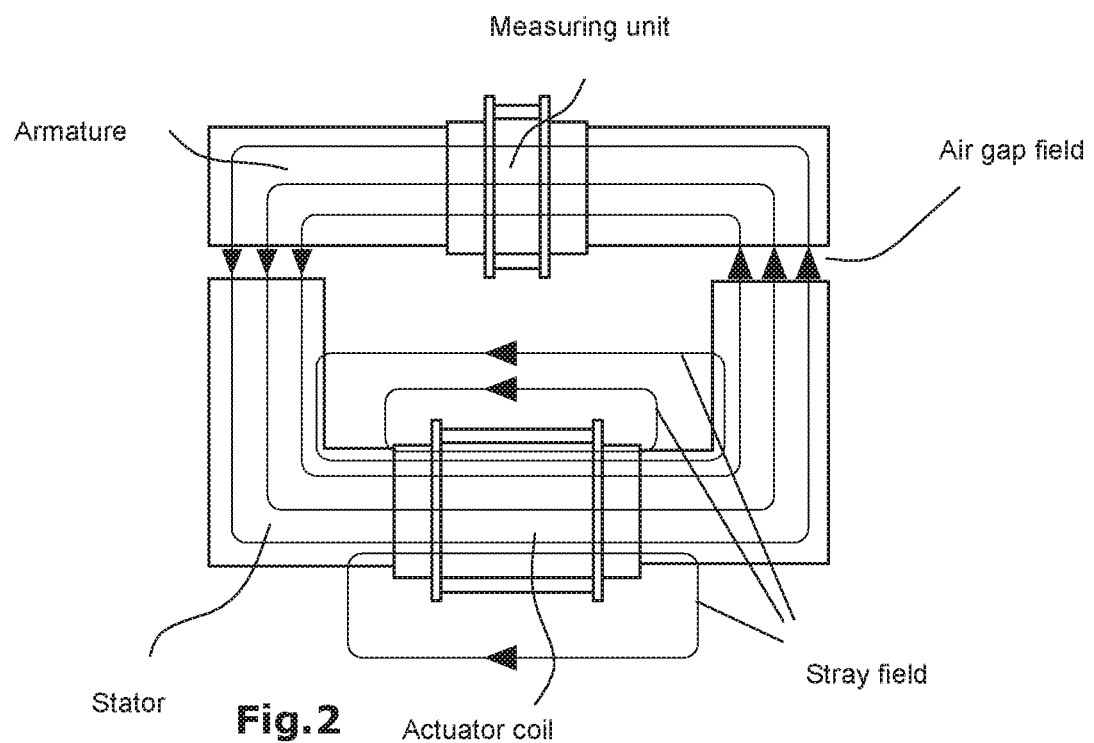
Figure 3:
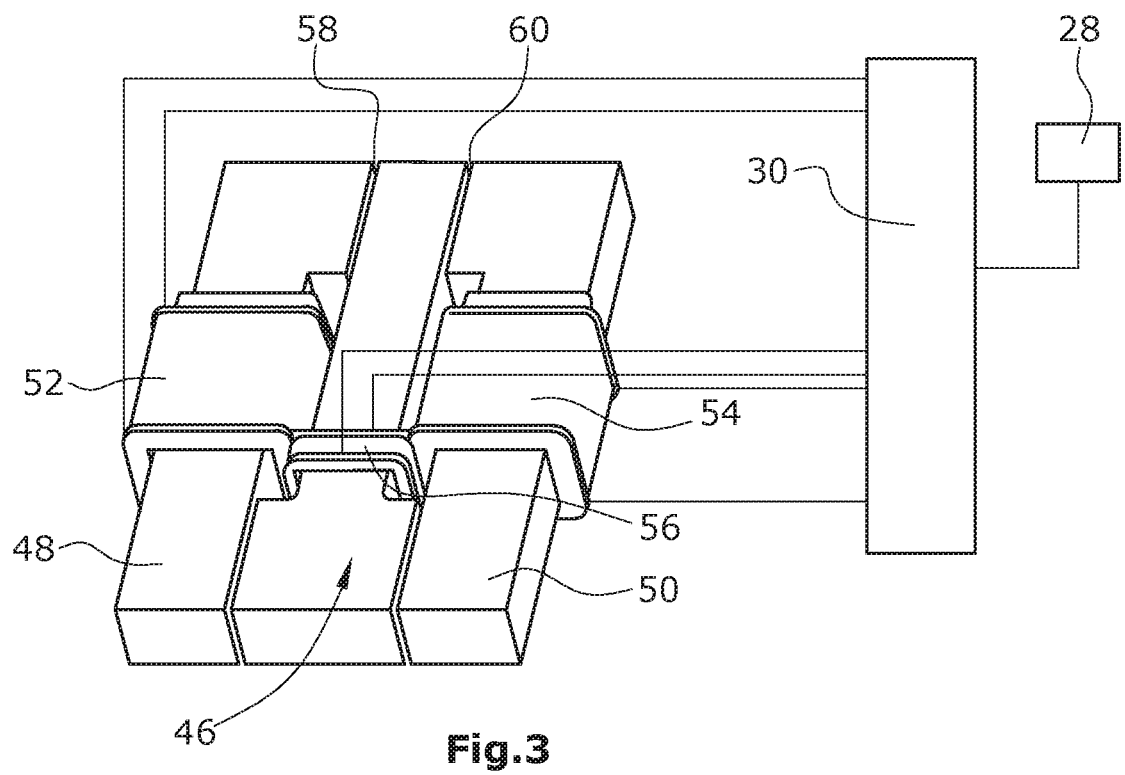
Figure 4:
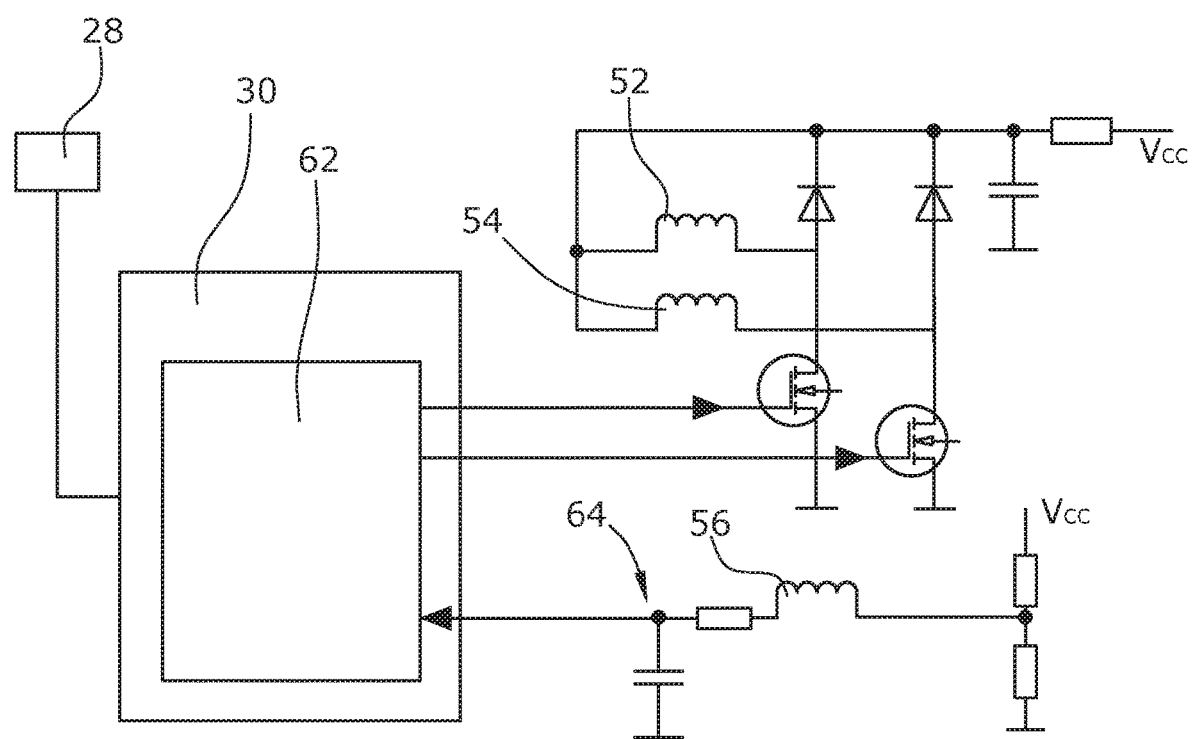

The invention will be described in greater detail hereunder by way of an exemplary embodiment and with reference to the drawing. In the several views, the following is shown:

FIG. 1 is a schematic lateral view of an operating unit for a vehicle component, with an operating element designed as a display element and with resilient support, and with active haptic feedback for actuating the operating element, FIG. 2 is a view of a solenoid, designed as armature magnet with stator and armature, for general illustration of the electromagnetically relevant characteristics of such a solenoid, FIG. 3 is a perspective view of the actuator, designed as dual solenoid, for active haptic feedback, FIG. 4 is a view of the possible circuitry of the solenoid according to FIG. 3, and FIGS. 5 to 8 are views of various embodiments of the arrangement and design of the return springs (both in the vertical and in the horizontal or oblique plane) for return movement of the operating element provided with active feedback, so that moments of rotation acting on the center of mass of the operating element that would evoke an oscillation of the operating element around its center of mass, will neutralize each other.

In FIG. 1, there is shown, in lateral view and schematically, an operating unit 10 comprising an operating element 12. In the present embodiment, the operating element 12 is designed as a display assembly having an operating surface 14 adapted to display a variety of symbol fields 16. In the normal case, the operating element 12 is backlit.

For performing an actuating movement in the vertical direction of movement (see the bi-directional arrow 18) and for confirmation of such an actuating movement in lateral direction (see the bi-directional arrow 20 in FIG. 1), the operating element 12 is elastically supported on a housing 26 via first return springs 22 and second return springs 24,24'. By means of a sensor 28, it can be detected that the operating element has moved along a vertical axis of movement. This is detected in an evaluation and control unit 30, whereupon the latter will control an actuator 32, designed as a solenoid, which comprises a drive element 34. The stationary stator portion 36 of actuator 32 is supported on the housing 26 while the drive element 34 of actuator 32 is mechanically coupled to the operating element 12. The axis of effective movement of drive element 34 is shown by the bidirectional arrow 38.

The larger and more complex the operating element 12 is designed, the heavier it is and the more installation space it occupies. If, now, it is demanded that the haptic feedback shall be identical across the entire operating surface 14, the operating element 12 should, during the haptic feedback, exclusively perform a translational movement. Theoretically, this could be achieved in the simplest manner by causing the drive element 34 of actuator 32 to engage in the center of mass 40 of operating element 12 or, more precisely, in the center of mass of the movable, resiliently supported partial system. This, however, is not possible due to the conditions of the installation space.

If, now, it is desired nonetheless to achieve that the operating element 12 during active haptic feedback will move exclusively in a translational manner, a constructionally relatively simple solution resides in arranging the actuator 32 in such a manner that the center of mass 40 of the movable partial system 41 comprising the operating element 12, the drive element 40 of actuator 32 and the masses of all return springs 22,24,24' is situated on the axis 38 of effective movement of the drive element 34 of actuator 32. This is shown in FIG. 1, while FIG. 1 further shows how the operating element 12 actively moves when an actuation movement is detected and the actuation of operating element 12 is confirmed by active feedback.

Substantially orthogonal to this plane 44, there extends the plane which is spanned by the lateral axis 20 of movement of operating element 12 and the axis 38 of effective movement of the drive element 34 of actuator 32. In relation to FIG. 1, this plane is the plane of the drawing.

Thus, the purely translational movement of the operating element 12 during active haptic feedback comprises both a lateral and a vertical component. That this feedback movement is not purely lateral does not play a role for the demand that the haptic feel should be equal across the entire operating surface 14 of operating element 12. What is decisive is that, during active haptic feedback, the operating element 12 is not subjected to any rotational movement portions so that there will occur a parallel displacement of the operating element 12 in space.

As already described further above, the actuator for the haptic feedback of operating elements is often provided in the form of a solenoid, particularly for reasons of installation space and costs. The force generated this solenoid can be estimated only with increased expenditure and is quite substantially dependent on the electric current and the air gap of the solenoid. The relevant conditions that are valid for a solenoid shall be explained below with reference to FIG. 2.

In FIG. 2, a solenoid is shown whose stator and actor are made of highly permeable materials (normally free cutting steel or electrical sheets) and whose magnetic field is built up by means of a powered exciter coil.

The force of such a solenoid is usually calculated from the exciter current and the size of the air gap. The force development in case of the haptic feedback is, however, very dynamic and comprises frequency portions above 1 kHz. In this regard, in case of the normally used free cutting steel and electrical sheets for magnetic flux guidance, the relationship between the electric current and the force is not trivial and can be described only by very complex modelling. Additionally, because of the mechanical tolerances and the movement of the operating surface, the air gap is not precisely known so that the force effect of an armature magnet can be estimated only roughly. Using "Maxwell's tensile force formula" and a measuring coil for detection of the magnetic flux density in the air gap, this problem can be circumvented, wherein, normally, the voltage measurement can be realized in a less expensive manner than a current measurement:

$$F = \frac{B_L^2 A_L}{2\mu_0}$$

(F—actuator force, $\mu_0$—permeability of the air, $A_L$—air gap area, $B_L$— magnetic flux density in the air gap)

The relatively low inhomogeneity of the air gap flux density in practical embodiments can be considered by using a correction factor, which in turn leads to a simple realization of a force measurement by means of a measuring coil:

$$F(t) = \frac{C}{\mu_0 A_L}\left(\frac{1}{N_{MS}} \int_0^t u(t')dt'\right)^2$$

(t—time, C—air gap correction factor, $N_{MS}$— winding number of the measuring coil, u(t)—induced voltage in the measuring coil)

The integration of the induced voltage can be performed digitally by use of a microcontroller which normally already exists in the system. Thus, the force is known at any point of time of the controlling.

In FIG. 3, the actuator 32 is shown in perspective view. This actuator 32 is designed as a dual solenoid whose drive element 34, realized as an armature 46 arranged between a first stator 48 and a second stator 50, can build up a force in two opposite directions along the axis 38 of effective movement. The first and the second stator 48, 50 are fastened the housing 26 while the armature 46 is tightly connected to the operating element 12. The first stator 48 comprises a first exciter coil 52 while the second stator 50 is provided with a second exciter coil 54. The armature 46 is surrounded by a measuring coil 56. On both sides of armature 46, a first and respectively a second air gap 58, 60 is arranged. Since the force acting on armature 46 shall be directed each time in one direction, the exciter coils 52, 54 will correspondingly be powered not simultaneously but alternately. The arrangement of measuring coil 56 on armature 46 allows for a precise and inexpensive force measurement in both effective directions along the axis 38 of effective movement.

The controlling and evaluating of the voltage induced in the measuring coil 56 can be performed e.g. by means of a microcontroller 62 which can be a part of the evaluating and control unit 30. An example for the wiring of microcontroller 62 is shown in FIG. 4. The induced voltage in the measuring coil 56 is first smoothed by a simple lowpass 64 so that the PWM clocking (normally of a frequency >20 kHz) for alternating controlling of the two exciter coils 52, 54 will be eliminated from the measuring signal. Then, the microcontroller 62 will capture the induced voltage and will integrate it digitally. The limiting frequency of the lowpass 64 should be sufficiently higher than the highest frequency portions of the force development.

Further above, it has already been described in connection with FIG. 1 that the return springs 22,24,24' are arranged in such a manner that their respective resulting spring effect axes 42,42' extend parallel to the axis 38 of effective movement of actuator 32 that is passing through the center 40 of mass. In order to avoid rotations of operating element 12 during the movement of the latter as induced by the return springs 22,24,24' (namely rotations both around an axis extending horizontally through the center 40 of mass of operating element 12 and vertically therethrough), the sum of the moments of rotation caused by the return springs 22,24,24' in the center 40 of mass should be zero. For this purpose, the resulting spring effect axes 42,42' should e.g. extend parallel to each other and to the axis 38 of effective movement (see also the spring force triangles of the return springs 22,24,24' in FIG. 1).

Thus, with an entirely symmetrical arrangement of the center 40 of mass and the return springs 22,24,24' (and respectively the points of engagement of the return springs 24,24' on the operating element 12) with identical characteristic lines of the (vertical) return springs 22 and characteristic lines of the (lateral) return springs 24,24', no moments of rotation caused by all return springs 22,24,24' will act, in the center 40 of mass, on the operating element 12 (see FIG. 1, where the distances L1 and L2 are identical). Such installation or arrangement conditions, however, cannot always be reached. In case that, for instance, the return springs 24,24' should be arranged asymmetrically (namely in the horizontal and/or in the vertical plane), moments of rotation will be caused in the center 40 of mass due to the lever arms, i.e. due to the distances of the resulting spring effect axes 42,42'—extending parallel to the axis 38 of effective movement of actuator 32—of the return springs 22 and 24 and respectively 22 and 24', to the center 40 of mass (and respectively the axis 38 of effective movement). These moments of rotation must neutralize each other in order to avoid a rotational oscillation of the operating element 12 around the center 40 of mass during the haptic feedback movement.

Figure 7:
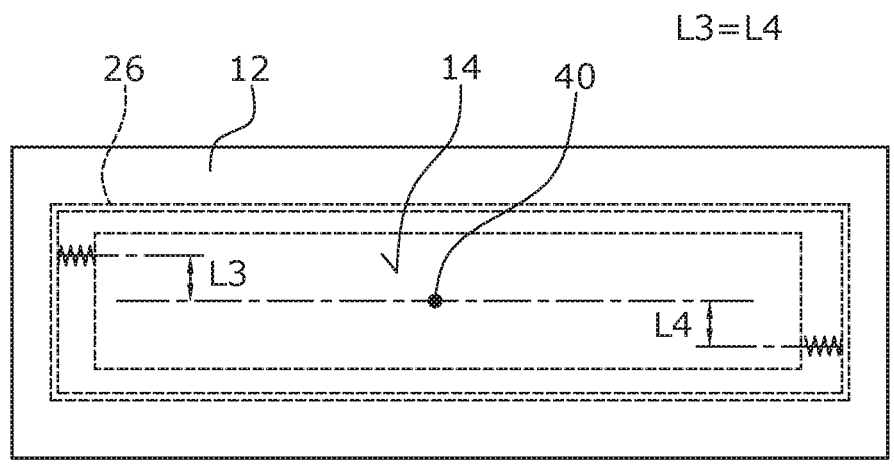
Figure 8:
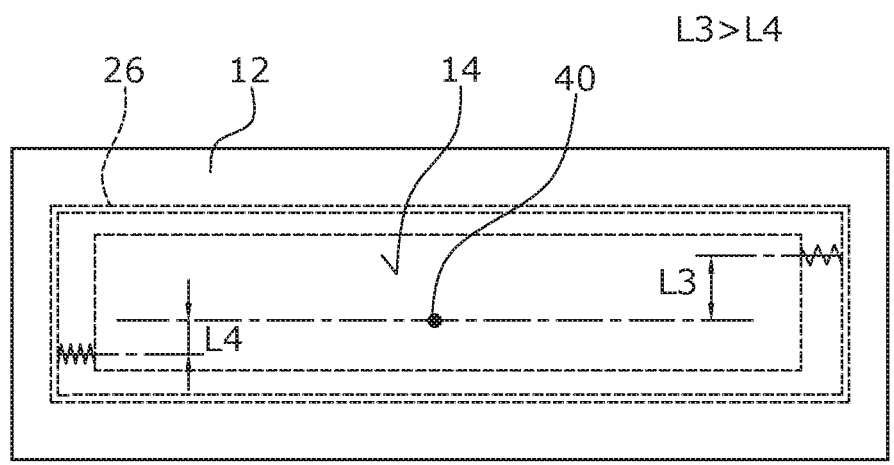

FIGS. 5 to 8 show various scenarios in which, in dependence on the position of the center 40 of mass, it is possible, by the arrangement of the return springs 22,24,24' (positions of the points of engagement of the return springs 22,24,24' on the operating element 12) and/or their elasticity (schematically indicated by the density of the windings, wherein a dense winding symbolizes a less elastic, i.e. stiffer spring than a less dense winding), to avoid/reduce an oscillation of the movable partial system 41 around its center 40 of mass, notably both in the vertical plane (see FIGS. 5 and 6) and in the horizontal plane (see Ah, FIGS. 7 and 8). The compensation of the moments of rotation of the return springs 22,24,24' arranged on both sides of partial system 41 can be achieved by the selection of the vertical and horizontal positions (see FIGS. 6 and 7) and/or by the selection of the spring forces (see FIGS. 5 and 8). Finally, the compensation of the moments of rotation can optionally also be achieved by influencing the center of mass of the movable, mechanically excited partial system 41 (e.g. by provision of additional weights, by influencing the mass distribution etc.).

The previously mentioned marginal conditions to the effect that all moments of rotation acting in the center 40 of mass of the partial system 41 will eliminate each other, can be conceived of as a two-dimensional problem (vertical and horizontal plane).

It may be required to provide e.g. two pairs of return springs 24,24' for being able to suppress or reduce an undesired rotation of the operating element 12 around two axes of rotation (horizontal and vertical), standing vertically on each other, through the center 40 of mass. The elastic coupling of the operating element 12 to the housing 26 is preferably realized by the holding frame, as is described in PCT/EP2017/051416 of Jan. 24, 2017 mentioned already initially. In this case, it is possible, e.g. by the thickness of the two lateral spring arms (which realize the function of the return springs 22,24,24') described in the PCT application PCT/EP2017/051416 and/or their cross-sectional shapes and/or their lengths and/or their height positions, to take an influence on the moments of rotation acting on the operating element 12.

A system that is "out of tune" can be optimized by one of the following measures:
the return springs are shifted with respect to their effective axes relative to the effective axis of the actuator,
the center of mass is shifted (by additional weights or by changing the geometric shape of the operating element),
the spring forces of the return springs acting in the normal direction can be different from return spring to return spring.

LIST OF REFERENCE NUMERALS 10 operating unit
12 operating element
14 operating surface of operating element
16 symbol fields
18 axis of vertical movement of operating element
20 axis of lateral movement of operating element
22 (vertical) return spring
24 (lateral) return spring
24' (lateral) return spring
26 housing
28 sensor
30 control unit
32 actuator
34 drive element of actuator
36 stator portion of actuator
38 axis of effective movement of actuator
40 center of mass of the movable partial system
41 movable partial system
42 resulting spring effect axis of return springs 24 and 22
42' resulting spring effect axis of return springs 24' and 22'
44 plane
46 anchor
48 stator
50 stator
52 exciter coil
54 exciter coil
56 measuring coil
58 air gap
60 air gap
62 microcontroller
64 lowpass
L1 (first) distance of the resulting effect axis of return springs 22,24 to the axis 38 of effective movement of actuator 32 (as viewed in the vertical plane)
L2 (second) distance of the resulting effect axis of return springs 22,24' to the axis 38 of effective movement of actuator 32 (as viewed in the vertical plane)
L3 (third) distance of the resulting effect axis of return springs 22,24 to the axis 38 of effective movement of actuator 32 (as viewed in the oblique plane spanned by the axis of effective movement)
L4 (fourth) distance of the resulting effect axis of return springs 22,24' to the axis 38 of effective movement of actuator 32 (as viewed in the oblique plane spanned by the axis of effective movement)

The invention claimed is:
1. An operating unit for a vehicle, particularly an infotainment system for control of diverse vehicle components, comprising
a housing having a front side,
an operating element arranged on the front side of the housing and comprising an operating interface,
wherein the operating element is mounted in a spring-elastic manner by means of return springs on and/or in the housing along a vertical axis of movement extending substantially orthogonally with respect to the operating surface and along a lateral axis of movement extending substantially transversely with respect to the vertical axis of movement,
at least one sensor for detecting an actuating movement of the operating element in the direction of the vertical axis of movement,
an actuator, arranged in and/or on the housing, for feedback movement of the operating element at least also in the lateral axis of movement when an actuation movement of the operating element is detected, wherein the actuator has an electrically activated drive element which is mechanically coupled to the operating element and can be moved forward and backward along an axis of effective movement, and an evaluating and control unit which is connected to the sensor and the actuator, wherein the return springs have resultant spring effect axes which extend parallel to the axis of effective movement of the actuator, wherein the spring effect axes of the return springs, when viewed in the vertical plane in which the axis of effective movement of the actuator extends and/or in which the center of mass of the operating element or of the movable partial system including inter alia the operating element and the drive element, coupled thereto, of the actuator is situated, extend on both sides of the axis of effective movement of the actuator at a first distance and respectively a second distance to the axis of effective movement of the actuator, and wherein the dimensioning of the return springs with respect to their spring forces and the dimensioning of the first and the second distance are selected to substantially compensate for the moments of rotation acting as a result of the return springs in the center of mass of the operating element or of the movable partial system.

2. The operating unit according to claim 1, wherein the spring effect axes of the return springs, when viewed in an oblique plane which extends vertically to the vertical plane and in which the axis of effective movement of the actuator extends and/or in which the center of mass of the operating element or of the movable partial system is situated, extends on both sides of the axis of effective movement of the actuator at a third distance and respectively a fourth distance to the axis of effective movement of the actuator, and wherein the dimensioning of the return springs with respect to their spring forces and the dimensioning of the third and the fourth distance are selected to substantially compensate for the moments of rotation acting as a result of the return springs in the center of mass of the operating element or of the movable partial system.

3. The operating unit according to claim 1, wherein the center of mass of the operating element or of the movable partial system is situated on the axis of effective movement of the drive element of the actuator.

4. The operating unit according to claim 2, wherein the center of mass of the operating element or of the movable partial system is situated on the axis of effective movement of the drive element of the actuator.

5. The operating unit according to claim 1, wherein the axis of lateral movement of the operating element and the axis of effective movement of the drive element of the actuator are situated in a common vertical plane extending substantially orthogonally to the operating surface.

6. The operating unit according to claim 5, wherein the housing below the operating element comprises an installation space, and wherein the actuator, for obtaining the smallest possible angle between the axis of effective movement of the drive element of the actuator and the axis of lateral movement of the operating element, is arranged as closely below the operating element as possible with regard to the installation space and/or as far away from the center of mass of the operating element as possible with regard to the installation space.

7. The operating unit according to claim 1, wherein the spring effect axes are arranged on the axis of lateral movement or on the axis of effective movement of the drive element of the actuator, or in a plane that is substantially orthogonal to a vertical plane in which the axis of effective movement of the drive element of the actuator and the axis of lateral movement of the operating element are situated, and symmetrically to the axis of lateral movement.

8. The operating unit according to claim 1, wherein the moments of rotation acting as a result of the return springs in the center of mass of the operating element or of the partial system will neutralize each other so that the operating element during its feedback movement along the axis of effective movement of the drive element of the actuator will not additionally twist or tilt.

* * * * *